(12) United States Patent
Jenkins et al.

(10) Patent No.: US 10,261,553 B2
(45) Date of Patent: Apr. 16, 2019

(54) DATA STORAGE DEVICE ENCLOSURE

(71) Applicant: Western Digital Technologies, Inc., Irvine, CA (US)

(72) Inventors: Dean Mitcham Jenkins, La Canada-Flintridge, CA (US); Robert P. Ryan, Mission Viejo, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 275 days.

(21) Appl. No.: 15/252,501

(22) Filed: Aug. 31, 2016

(65) Prior Publication Data

US 2018/0059742 A1 Mar. 1, 2018

(51) Int. Cl.
| | |
|---|---|
| *G06F 1/18* | (2006.01) |
| *G06F 13/40* | (2006.01) |
| *G06F 13/42* | (2006.01) |
| *H05K 7/14* | (2006.01) |
| *G11B 33/12* | (2006.01) |

(52) U.S. Cl.
CPC .......... *G06F 1/187* (2013.01); *G06F 13/4022* (2013.01); *G06F 13/4068* (2013.01); *G06F 13/4282* (2013.01); *G11B 33/126* (2013.01); *G11B 33/128* (2013.01); *H05K 7/1459* (2013.01); *H05K 7/1488* (2013.01)

(58) Field of Classification Search
CPC .............. G06F 13/4022; G06F 13/4068; G06F 13/4282; G06F 1/187; G11B 33/126; G11B 33/128; H05K 7/1459; H05K 7/1488
See application file for complete search history.

(56) References Cited

U.S. PATENT DOCUMENTS

| | | | |
|---|---|---|---|
| 5,982,634 A | 11/1999 | Wronski | |
| 2007/0276982 A1* | 11/2007 | Denning | G06F 13/409 710/317 |
| 2013/0050955 A1* | 2/2013 | Shinsato | G06F 1/181 361/727 |
| 2014/0215458 A1 | 7/2014 | Devarapalli et al. | |
| 2016/0328159 A1* | 11/2016 | Coddington | G06F 3/0613 |

FOREIGN PATENT DOCUMENTS

| | | |
|---|---|---|
| EP | 2562616 A2 | 2/2013 |
| WO | 2016053197 A1 | 4/2016 |

OTHER PUBLICATIONS

International Search Report and Written Opinion dated Oct. 5, 2017, from related International Application PCT/US2017/039341, 12 pgs.
Newisys, Inc.; EDA-4605 Product Sheet, 2013; accessed on Oct. 30, 2018; available atwww.sanmina.com/pdf/newisys_4605.pdf.
Super Micro Computer, Inc.; "SuperStorage—Kinetic Ethernet Attached Storage: Simplifying the structure of large scale object storage", 2014; accessed on Oct. 30, 2018; available at https://www.supermicro.com/products/nfo/files/storage/d_SSG-K1048-RT.pdf.

* cited by examiner

*Primary Examiner* — James Wu
(74) *Attorney, Agent, or Firm* — Barry IP Law, P.C.

(57) ABSTRACT

A Data Storage Device (DSD) enclosure includes a chassis and at least one backplane mounted in the chassis. According to one aspect, each backplane includes a row of DSD slots and a switch slot located in a middle portion of the row of DSD slots. A plurality of signal traces connect the DSD slots to the switch slot.

28 Claims, 5 Drawing Sheets

DATA STORAGE DEVICE ENCLOSURE

BACKGROUND

Data Storage Devices (DSDs) are often used to record data onto storage media or to access data from a storage media. DSDs may be housed within a chassis of an enclosure and may be accessed by computing devices. However, data communicated to and from the DSD may experience integrity issues based on the arrangement of DSDs within the chassis of the enclosure.

A backplane conventionally used for devices using SAS and SATA protocols to communicate data may not be appropriate for newer communication protocols and devices using the newer communication protocols. SAS and SATA protocols incorporate techniques such as pre-emphasis and equalization for signal conditioning. These techniques allow the signals to be communicated across long signal traces and lengths.

Drives using newer communications protocols may provide lower latency and lower bandwidth than SAS or SATA disk drives, but may be designed for transmission across shorter communication lengths. These newer communications protocols may not incorporate techniques that allow the signal to be communicated across signal traces suitable for SAS and SATA. As such, using conventional backplanes with devices using communications protocols designed for shorter communication lengths may create problems.

BRIEF DESCRIPTION OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

DETAILED DESCRIPTION

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

As used herein, a single reference number may be used to generally refer to one or more elements having the reference number followed by a letter. For example, switch slot 310 may be used when describing either first switch slot 310A or second switch slot 310B, or switch slot 310 may be used to refer to all switch slots 310A-310B collectively.

Figure 1A:
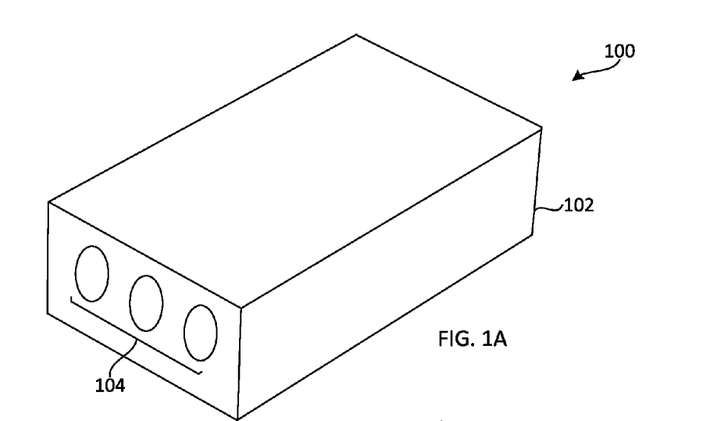
FIGS. 1A and 1B are perspective views of a chassis of an enclosure according to an embodiment.

FIG. 1A shows a perspective view of a chassis 102 for an enclosure 100. As used herein, chassis may refer to a frame or structure in which one or more Data Storage Devices (DSDs) are housed, and enclosure may refer to a larger unit housing one or more chasses. Enclosure 100 may be part of a storage network providing interconnection between one or more host computers and one or more storage enclosures such as enclosure 100. The storage network may include networking communication technologies suitable for high-volume data transfers between host computers and storage enclosures.

In an example embodiment, an enclosure 100 may include multiple chasses 102, with each chassis 102 including rails which are part of a drawer system configured to allow the chassis 102 to move horizontally into and out of the enclosure 100. These drawer-like chasses 102 may be arranged such that each chassis is located on top of another. Chassis 102 includes one or more fans 104 configured to cool the devices housed inside the chassis 102. Fans 104 may bring in air from outside the chassis 102, which may be cooler than air inside chassis 102, thereby providing cooling for devices housed inside the chassis 102.

Figure 1B:
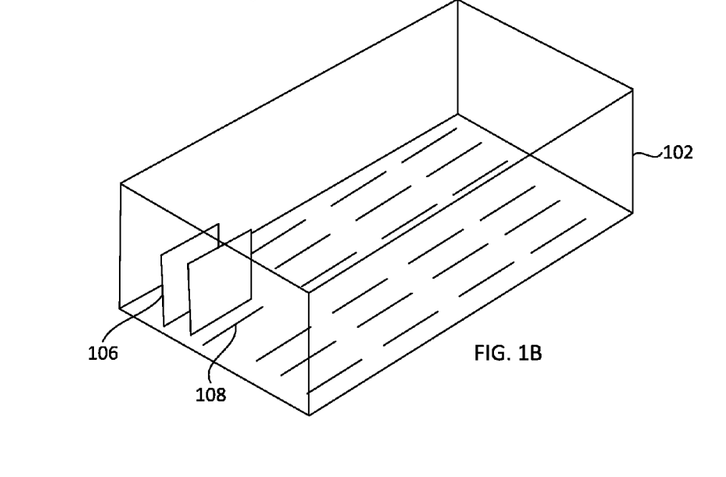

FIG. 1B shows a perspective view of the inside of chassis 102 according to an embodiment. The chassis 102 contains multiple DSDs 106 and DSD slots 108. The DSDs 106 may include Non-Volatile Memory (NVM) in the form of rotating magnetic disk, Non-Volatile Solid-State Memory (NVSM), and/or other types of memory. DSD 106 can be considered a Solid-State Hybrid Drive (SSHD) when it includes both solid-state and disk media. In addition, a DSD may have some processing power built within the storage device, such is the case for Ethernet drives.

DSD slots 108 may be a connector configured to operatively connect each DSD 106 to a backplane (shown in FIGS. 3-5) of chassis 102. The DSDs 106 may be connected to the DSD slots in a vertical orientation such that a length of the DSD 106 is parallel with a height of the chassis 102 and perpendicular with the length and width of the chassis 102. The vertical orientation may be referred to as a "tombstone" system. This orientation may allow for the cooling air provided by the fans 104 to move between the DSDs 106 to more effectively cool the DSDs 106.

In an example embodiment, the chassis 102 is a 4 U chassis, having a height of 7 inches, a width of 19 inches, and a depth of 36 inches. In another example embodiment, the chassis 102 is a 5 U chassis, having a height of 8.75 inches, a width of 19 inches, and a depth of 36 inches. In the example embodiments disclosed herein, the measurements disclosed may be approximate measurements, which may be longer or shorter by up to 25%.

Figure 2:
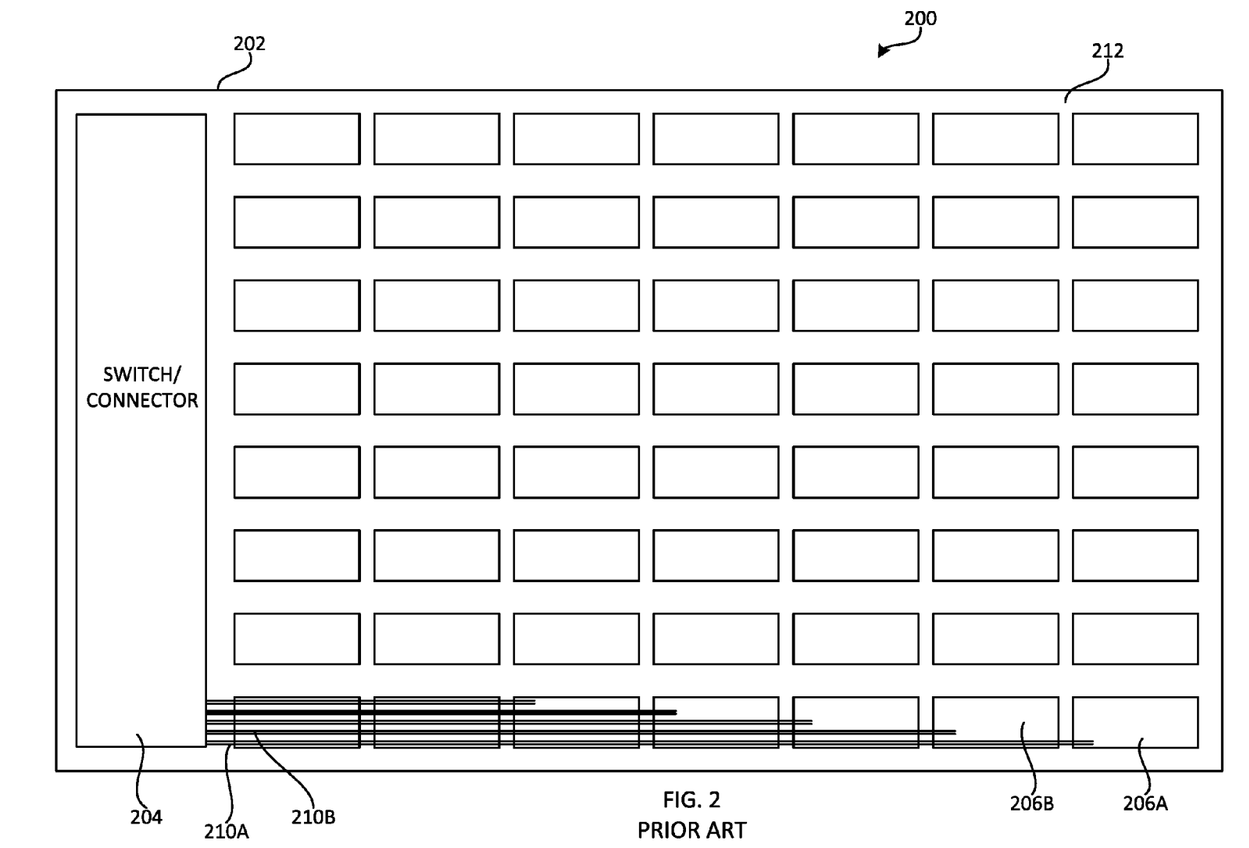
FIG. 2 is a block diagram of a prior art chassis and backplane.

FIG. 2 is a block diagram of a prior art chassis 202 of an enclosure 200. Chassis 200 may be part of a conventional JBOD (Just a Bunch of Disks) or RAID (Redundant Array of Independent Disks) enclosure. Chassis 200 includes slots 206 and switch/connector 204. The switch/connector 204 communicates with disks connected to slots 206 and facilitates data communication to and from the disks.

Backplane 212 may be a printed circuit board and conventionally used for devices using SAS and SATA protocols to communicate data. SAS and SATA protocols incorporate techniques such as pre-emphasis and equalization for signal conditioning. These techniques allow the signals to be communicated across long signal traces and lengths, such as signal traces 210 of FIG. 2.

However, using prior art backplane 202 with devices using communications protocols designed for shorter communication lengths may create problems. For example, when SAS or SATA disks are replaced with microservers with Ethernet interfaces (otherwise known as "Ethernet disk drives" or "Ethernet drives") using Serial Gigabit Media Independent Interface (SGMII) signals, use of prior art backplane 212 may result in decreased signal integrity.

Ethernet disk drives may provide lower latency and lower bandwidth than SAS or SATA disk drives. Due to its use of low voltage differential signaling (LVDS) as a transmission mechanism, SGMII is not well suited to allow the signals to be communicated across longer signal traces that may otherwise be suitable for SAS and SATA. SGMII signals are designed to be transmitted over relatively short distances, as they are intended to drive to a PHY (physical layer chip), which drives the signals over cables across much longer distances.

If prior art backplane 212 is used with disks connected to slots 206 using SAS or SATA, the switch/connector 204 is able to communicate with a disk in slot 206A, as SAS and SATA incorporate techniques designed for transmission over the length of the chassis 202. However, if an Ethernet drive is connected to slot 206A, the switch/connector 204 may experience issues communicating SGMII signals over longer signal traces 210A or 2106. For example, the length of chassis 202 may be 36 inches, and an SGMII signal may be suitable for signal transmission across a maximum signal trace length of between 12 inches and 18 inches before experiencing loss of quality. Accordingly, SGMII signals transmitted via the longest signal trace 210A of chassis 202, which spans substantially the entire 36 inch length of the chassis 202, may experience interference or other signal degradation issues. Interference may be caused by other signal traces, and the problem could be made worse with the routing of a large number of signal traces to support all the DSDs in a chassis. The same signal issue is further worsened as the industry moves to higher and higher communication speeds in the various protocols.

Figure 3:
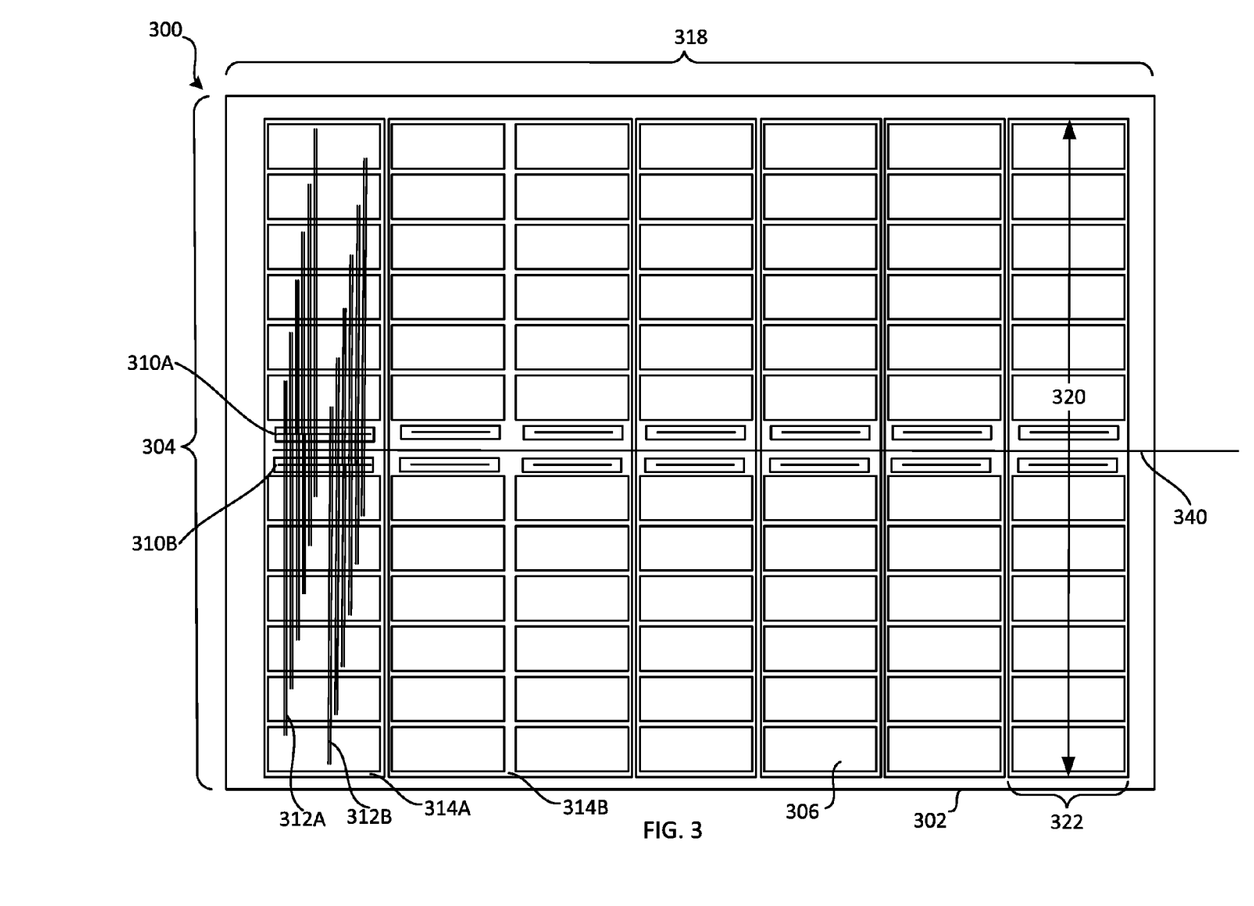
FIG. 3 is a block diagram illustrating signal traces of a modular backplane of a chassis according to an embodiment.

FIG. 3 is a block diagram of a modular backplane of a chassis according to an embodiment. Chassis 302 of enclosure 300 includes multiple backplanes 314 (of which backplanes 314A and 314B are individually labeled). For example, backplane 314A includes the left most column of slots in the figure, and backplane 314B includes the second- and third-left most columns of slots in the figure. Each backplane 314 includes multiple DSD slots 306, and each DSD slot 306 is configured to receive a DSD (e.g., DSD 106). In some embodiments, some of the slots may be used to receive a compute device. The row of DSD slots 306 and DSDs may span the length 320 of the backplane 314 and the width 304 of the chassis 302. Each backplane 314 may have one or more rows of DSD slots 306 and DSDs. For example, backplane 314A includes a single row of DSD slots 306 and backplane 314B is a multiple-row backplane, which includes two rows of DSD slots 306. Any backplane 314 may have any number of rows of DSD slots 306. While twelve DSD slots 306 are shown in each row of DSD slots 306, any number of DSD slots 306 may be in the row of DSD slots 306.

Each backplane 314 also includes one or more switch slots 310. Switch slot 310 is configured to receive a switch configured to facilitate communication to and from the DSD connected to the DSD slot 306.

As illustrated in FIG. 3, each row of a backplane 314 includes two switch slots 310. Where a backplane has more than one row, the backplane may have more than two switch slots. For example, backplane 314A, which has one row of DSD slots 306, includes two switch slots 310A and 310B. Backplane 314B, which has two rows of DSD slots 306, includes four switch slots. While FIG. 3 illustrates a row as having two switch slots 310, each row may include one switch slot 310 or more than two switch slots 310.

Switch slot 310 may be located in a middle portion of the backplane 314. The middle portion of the backplane 314 may be a location range of the backplane 314 where areas of the backplane 314 on either side of the switch slot 310 are substantially the same. As used herein, "substantially" may refer to at least 50%, such that a first area substantially similar to a second area is at least 50% similar. Accordingly, the number of DSD slots 306 on either side of the switch slot 310 may be the same or substantially similar. For example, if a backplane 314 has 12 total DSD slots 306 arranged in a row, the switch slot 310 may be located between the sixth and seventh DSD slot, such that there are six DSD slots on one side of the switch slot 310 and six DSD slots on the other side of the switch slot 310. In another example, a backplane may have 11 total DSD slots arranged in a row, and the switch slot may be located between the sixth and seventh DSD slot, such that there are five DSD slots on one side of the switch slot and six DSD slots on the other side of the switch slot. In addition, an area of the backplane 314 on either side of the switch slot 310 may be the same or substantially similar. For example, an area of the backplane 314 located on one side of switch slot 310 may be 30 square inches and an area of the backplane 314 located on the other side of the switch slot 310 may be 28 square inches.

Backplane 314 may be a printed circuit board and may include signal traces 312. There may be a pair of sets of signal traces 312 corresponding to each DSD slot 306 such that a switch slot 310 is connected to each of the DSD slots 306 of the row of DSD slots on the backplane 314. For example, backplane 314A includes a row of DSD slots 306, switch slot 310A and switch slot 310B. Backplane 314A also includes a first set of signal traces 312A connecting the switch slot 310A to each of the DSD slots 306 of backplane 314A. Backplane 314A further includes a second set of signal traces 312B connecting switch slot 310B to each of the DSD slots 306 of backplane 314A.

As shown in FIG. 3, each DSD slot 306 in a row of DSD slots 306 of a backplane 314 may be connected to two switch slots 310 via two sets of signal traces 312. By having a given DSD slot 306 connected to two different switch slots 310, redundancy may be achieved and/or throughput may be increased. In addition, if a switch of a switch slot 310 is replaced or serviced, the backplane 314 does not require deactivation, which can facilitate hot-swapping the switch. For example, if a switch connected to switch slot 310A is in need of repair, the system may rely on a switch connected to switch slot 310B to facilitate communication to and from the DSDs connected to the DSD slots 306 while switch slot 310A is not connected to a switch.

While FIG. 3 illustrates two switch slots 310 for each row of DSDs and DSD slots 306, a single switch slot 310 with a single set of signal traces may be used. Likewise, more than two switch slots 310 and more than two sets of signal traces may be used as well, to increase redundancy and/or increase throughput.

Data may be communicated between DSDs connected to the DSD slots 306 and a switch connected to the switch slot 310 via the signal traces 312. Data may be communicated between the switch and a host computer or storage controller via switch connection 340. In some implementations, switch connection 340 can provide a high speed connection to a storage controller or host computer, such as a server. Switch connection 340 may include any communication means, such as a card or set of cables. While FIG. 3 illustrates switch connection 340 being between pairs of switch slots 310, switch connection 340 may be located below a plane formed by the backplanes 314, and connected to the backplanes 314 on a side opposite the side including the DSD slots 306 and switch slots 310. Data communicated via the signal traces 312 may be SGMII signals, as described herein. Data communicated via the switch connection 340 may be Ethernet signals.

Switch connection 340 may also be arranged to allow for an easy insertion and removal of switches from switch connection 340. For example, switches may be in a smaller board form factor that is inserted into switch slots 310, and switch connection 340 may be a larger board that runs the length of the chassis, between the pairs of inserted switches, along the line 340. Such an arrangement may include a hat connector to connect each switch to the switch connection 340 board, and the hat connector can be easily connected or removed from the switch to facilitate hot swapping the switch for an upgraded switch or a replacement switch.

In some embodiments, backplane length 320 is longer than backplane width 322 and chassis length 318 is longer than chassis width 304. The backplanes 314 are mounted in the chassis 302 such that the backplane length 320 is parallel to the chassis width 304 and perpendicular to the chassis length 318. That is, the backplanes 314 are arranged side by side, along the chassis length 318, with each backplane 314 spanning the chassis width 304. The backplane width 322 is parallel to the chassis length 318 and perpendicular to the chassis width 304. The switch slots 310 and the DSD slots 306 may be parallel to each other.

As the switch slot 310 is located in the middle portion of the backplane 314, signal traces 312 are generally shorter than the signal traces 210 of prior art backplane 212. While the longest signal trace 210 of prior art backplane 212 is substantially the length of the chassis 202, the longest signal trace 312 of backplane 314 is less than half the width 304 of the chassis 302. This significantly shorter signal trace length promotes increased signal integrity when communicating data using SGMII signals to and from Ethernet drives. While signal traces are shown for only the leftmost backplane 314, each backplane 314 includes signal traces 312 connecting the switch slot 310 to each of the DSD slots 306. In addition, the traces need not be run parallel to the width of the chassis as shown in the backplane 314A. They may run diagonally, for example, to connect each switch slot to each DSD slot in the multiple-row backplane 314B. Even in that configuration the signal traces are still significantly shorter than the length of the chassis 318.

In addition to the increased signal integrity provided by the arrangement of the backplanes 314, cost may also be improved when comparing the backplanes 314 with prior art backplane 212. Backplanes 314, which are smaller than prior art backplane 212, may be more cost efficient in both manufacturing cost and maintenance cost, as they may be cheaper to fabricate and to replace. Further, the modular nature of backplanes 314 increases serviceability ease, as a damaged, degraded or otherwise outdated backplane 314 may be removed from the chassis 302 and replaced, without disturbing the operation of other backplanes 314 within the chassis 302. Also, as will be described herein, the configuration flexibility of the chassis 302 may be increased, as each backplane 314 may be capable of different data transfer rates. In an example embodiment, backplane 314A may be capable of data transfer at 1 GB/sec and backplane 314B may be capable of data transfer at 5 GB/sec. Prior art backplane 212 is capable of merely a single data transfer rate.

Figure 4:
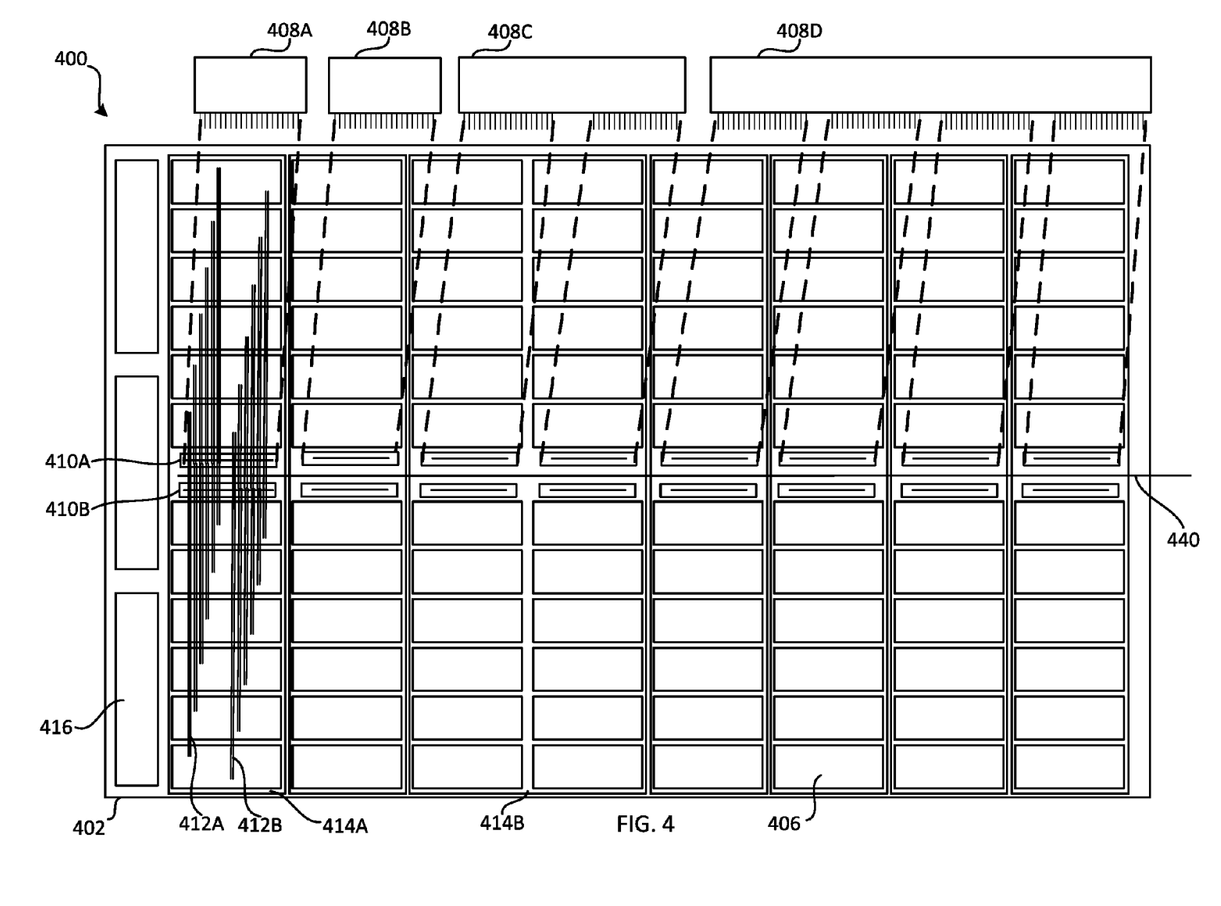
FIG. 4 is a block diagram of a modular backplane of a chassis according to an embodiment.

FIG. 4 is a block diagram of a modular backplane of a chassis according to an embodiment. Elements of FIG. 4 may be similar to elements of FIG. 3 and are numbered similarly.

Chassis 402 of enclosure 400 includes multiple backplanes 414. Each backplane 414 includes multiple DSD slots 406 in a row, and each DSD slot 406 is configured to receive a DSD (e.g., DSD 106). Chassis 402 also includes multiple fans 416 similar to fans 104. As described herein, fans 416 are configured to cool the DSDs connected to DSD slots 406. The chassis 402 may be oriented within the enclosure 400 such that the front of chassis 402 is shown on the left side of FIG. 4 and the rear of chassis 402 is shown on the right side of FIG. 4. While a set of fans 416 are shown on the front side of the chassis 402, an additional set of fans may be located on the rear side of the chassis 402, such that one set of fans pulls air into the chassis 402 and the other set of fans pushes air out of the chassis 402. Other implementations may use a different cooling technique in addition to or in place of fans 416.

A switch slot 410 located in a row of DSD slots 406 is connected to each DSD slot 406 by signal traces 412. While only two sets (412A and 412B) of signal traces 412 are shown, each backplane 414 includes one or more sets of signal traces 412 connecting the switch slot 410 to the DSD slots 406. The number of sets of signal traces 412 for a backplane 414 may be based on the number of switch slots included in the backplane 414. For example, a backplane having one switch slot may have one set of signal traces connecting the switch slot to each DSD slot. In another example, a backplane having two switch slots may have two sets of signal traces connecting the switch slots to each DSD slot—one set of signal traces for each switch slot.

Switches 408 are connected to the switch slots 410. While a single switch 408 is shown for each row of DSD slots having two switch slots, each switch slot 410 may receive, and is connected to, its own switch. For example, in practice, backplane 414A may have two switches inserted. Switches 408 may be configured to coordinate signal communications to and from DSDs (e.g., DSD 106) connected to DSD slots 406. In some implementations, switches 408 may be Ethernet switches.

As shown in FIG. 4, switches 408 may be of varying sizes and may span various numbers of switch slots 410 and backplanes 414. For example, switch 408A spans a single backplane 414A, is connected to switch slot 410A, and is configured to communicate with DSDs connected to DSD slots 406 of single-row backplane 414A via signal traces 412A. Switch 408C spans a multiple-row backplane 414B having two rows of DSD slots 406. Switch 408D spans four single-row backplanes 414. Switches 408C and 408D span more than one row of DSD slots 406, allowing each switch to coordinate data communications with more DSDs than if the switch was connected to a single row of DSD slots 406.

Each backplane 414 and switch 408 pairing may be capable of a different data transfer rate. For example, switches connected to backplane 414A may provide data transfer at 1 GB/sec and switches connected to backplane 414B may provide data transfer at 4 GB/sec. In some implementations, the data transfer rate may be based on the type of DSD connected to DSD slot 406. For example, a first type of DSD may be connected to each DSD slot 406 of a first row, and a second type of DSD may be connected to each DSD slot 406 of a second row. The first row may output data at a first speed and the second row may output data at a second speed.

Data may be output via switch connection 440. Switch connection 440 may be configured to communicate data from multiple switches outputting data at different speeds. In some implementations, switch connection 440 can provide a high speed connection to a storage controller or host computer, such as a server. Switch connection 440 may include any communication means, such as a card or set of cables. While FIG. 4 illustrates switch connection 440 being between pairs of switch slots 410, switch connection 440 may be located above or below a plane formed by the backplanes 414. Data communicated via the signal traces 412 may be SGMII signals, as described herein. Data communicated via the switch connection 440 may be Ethernet signals.

Switch connection 440 may also be arranged to allow for an easy insertion and removal of switches from switch connection 440. For example, as described above with respect to FIG. 3, switch connection 440 may include a hat connector for each switch that can be easily connected or removed from the switch to facilitate hot swapping the switch for an upgraded switch or a replacement switch.

In some implementations, when enclosure 400 is a 4 U enclosure, up to 96 DSDs may be housed within the chassis 402. Switches 408 may be easier to replace and/or maintain than prior art switch/connector 204, as prior art switch/connector 204 may be located in the rear of the chassis 202, thus requiring rear access or complete removal of the chassis 202. By contrast, switches 408 may be accessed without removal of the chassis 402 or rear access, as they are located along the chassis length 418 in a middle portion of the chassis 402.

Figure 5:
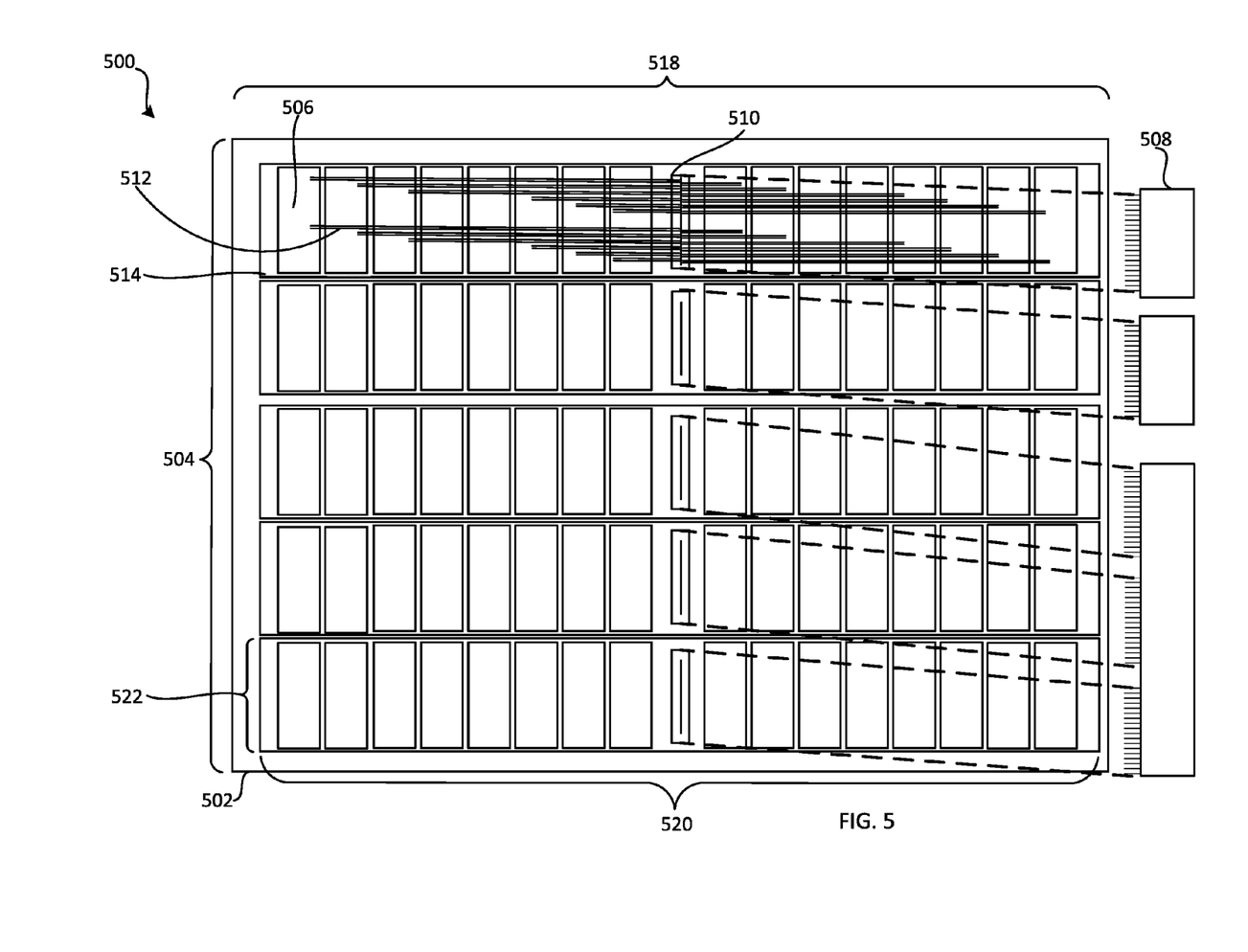
FIG. 5 is a block diagram of a modular backplane of a chassis in another orientation according to an embodiment.

FIG. 5 is a block diagram of a modular backplane of a chassis according to an embodiment. Elements shown in FIG. 5 may be similar to those shown in FIG. 4, and are numbered similarly.

Chassis 502 of enclosure 500 includes multiple backplanes 514. Each backplane 514 includes multiple DSD slots 506, and each DSD slot 506 is configured to receive a DSD (e.g., DSD 106). Chassis 502 and the DSDs therein may be cooled by an arrangement of fans or other cooling systems and mechanisms such that the DSDs operate without overheating.

In some embodiments, backplane length 520 is longer than backplane width 522 and chassis length 518 is longer than chassis width 504. The backplanes 514 are mounted in the chassis 502 such that the backplane length 520 is parallel to the chassis length 518. That is, the backplanes 514 are arranged side by side, along the chassis width 504, with each backplane 514 substantially spanning the chassis length 518. The backplane width 522 is parallel to the chassis width 504.

The switch slots 510 and the DSD slots 506 may be parallel to each other. The switch slot 510 is connected to each DSD slot 506 by a signal trace 512. As shown in FIG. 5, two sets of signal traces 512 correspond to each DSD slot 506, to provide redundancy. While one switch slot 510 and one switch 508 pairing per row is shown, any number of switch slot and switch pairings may be included in a row, including two switch slots and two switches, as shown in FIG. 4.

The longest signal trace 512 is less than half the chassis length 518, which is significantly shorter than the prior art configuration of FIG. 2, where the longest signal trace is substantially the entire chassis length. While six pairs of signal traces 512 are shown for a set of eight DSD slots 506 (half of a row of DSD slots), each DSD slot 506 is connected to the switch slot 510 by a pair of respective signal traces 512.

Switches 508 are connected to the switch slots 510. Switches 508 may be configured to coordinate signal communications to and from DSDs (e.g., DSD 106) connected to DSD slots 506. In some implementations, switches 508 may be Ethernet switches. As shown in FIG. 5, switches 508 may be of varying sizes and may span various numbers of switch slots 510 and backplanes 514.

OTHER EMBODIMENTS

The foregoing description of the disclosed example embodiments is provided to enable any person of ordinary skill in the art to make or use the embodiments in the present disclosure. Various modifications to these examples will be readily apparent to those of ordinary skill in the art, and the principles disclosed herein may be applied to other examples without departing from the spirit or scope of the present disclosure. The described embodiments are to be considered in all respects only as illustrative and not restrictive and the scope of the disclosure is, therefore, indicated by the following claims rather than by the foregoing description. All changes which come within the meaning and range of equivalency of the claims are to be embraced within their scope.

What is claimed is:

1. A Data Storage Device (DSD) enclosure, comprising:
   a chassis;
   a plurality of backplanes mounted in the chassis, the plurality of backplanes each including:
      a row of DSD slots;
      a switch slot located in the row of DSD slots; and
      a plurality of signal traces connecting the DSD slots to the switch slot; and
   at least one switch connected to two or more switch slots across two or more backplanes of the plurality of backplanes.

2. The DSD enclosure of claim 1, wherein a backplane length of the two or more backplanes is longer than a backplane width of the at least one backplane,
   wherein a chassis length of the chassis is longer than a chassis width of the chassis, and
   wherein the is mounted in the chassis so that the backplane length is parallel to the chassis width.

3. The DSD enclosure of claim 2, wherein a length of a longest signal trace of the plurality of signal traces is less than half the chassis width.

4. The DSD enclosure of claim 1, wherein a backplane length of the plurality of backplanes is longer than a backplane width of the plurality of backplanes,
   wherein a chassis length of the chassis is longer than a chassis width of the chassis, and
   wherein the plurality of backplanes is mounted in the chassis so that the backplane length is parallel to the chassis length.

5. The DSD enclosure of claim 1, wherein at least one backplane of the plurality of backplanes further includes:
   a second switch slot located in the row of DSD slots;
   a second plurality of signal traces connecting the DSD slots to the second switch slot;
   a first switch connected to the switch slot; and
   a second switch connected to the second switch slot; and
   wherein the DSD enclosure further comprises a switch connection connected to the first switch and the second switch, the switch connection configured to facilitate data communication to and from each of the first and second switches.

6. The DSD enclosure of claim 5, wherein the switch connection includes at least one of a cable or a card configured to provide Ethernet communication to and from each of the first and second switches.

7. The DSD enclosure of claim 1, wherein a first backplane of the plurality of backplanes includes a first switch constructed to provide a first maximum data transfer rate and a second backplane of the plurality of backplanes includes a second switch constructed to provide a second maximum data transfer rate different from the first maximum data transfer rate.

8. The DSD enclosure of claim 1, further comprising at least one Ethernet switch connected to one or more switch slots of the plurality of backplanes.

9. The DSD enclosure of claim 1, wherein the plurality of signal traces are configured to transmit signals comprising Serial Gigabit Media Independent Interface (SGMII) signals.

10. The DSD enclosure of claim 1, wherein at least one backplane of the plurality of backplanes includes a multiple-row backplane with more than one row of DSD slots.

11. The DSD enclosure of claim 1, wherein the switch slot of each of the plurality of backplanes is located in a middle portion of the row of DSD slots.

12. A backplane comprising:
a row of Data Storage Device (DSD) slots arranged along the backplane, the row of DSD slots configured to receive a plurality of DSDs;
a switch slot located in the row of DSD slots, the switch slot configured to receive a switch that is connected to one or more additional switch slots of additional backplanes; and
a plurality of signal traces configured to communicatively couple the switch to each of the plurality of DSDs.

13. The backplane of claim 12, wherein:
the backplane is suitable to be mounted in a chassis of a DSD enclosure,
a backplane length of the backplane is longer than a backplane width of the backplane,
a chassis length of the chassis is longer than a chassis width of the chassis, and
the backplane mounted in the chassis so that the backplane length is parallel to the chassis width.

14. The backplane of claim 13, wherein a length of a longest signal trace of the plurality of signal traces is less than half the chassis width.

15. The backplane of claim 12, wherein:
the backplane is suitable to be mounted in a chassis of a DSD enclosure,
a backplane length of the backplane is longer than a backplane width of the backplane,
a chassis length of the chassis is longer than a chassis width of the chassis, and
the backplane is mounted in the chassis so that the backplane length is parallel to the chassis length.

16. The backplane of claim 12, wherein the switch slot is further configured to receive an Ethernet switch.

17. The backplane of claim 12, wherein the plurality of signal traces are configured to transmit signals comprising Serial Gigabit Media Independent Interface (SGMII) signals.

18. The backplane of claim 12, wherein an equal number of disk drive slots are located on either side of the switch slot.

19. The backplane of claim 12, further comprising a second row of DSD slots arranged along the backplane, the second row of DSD slots configured to receive a second plurality of DSDs.

20. The backplane of claim 12, wherein the switch slot is located in a middle portion of the row of DSD slots.

21. A system comprising:
a plurality of backplanes, each backplane comprising:
a row of Data Storage Device (DSD) slots,
a plurality of Ethernet switch slots located in the row of DSD slots, and
a plurality of signal traces connecting the DSD slots to the plurality of Ethernet switch slots, such that each Ethernet switch slot is connected to each of the DSD slots;
a first DSD connected to a first DSD slot of a first backplane;
a first Ethernet switch connected to a first Ethernet switch slot of the first backplane;
a second Ethernet switch connected to a second Ethernet switch slot of the first backplane, the first Ethernet switch and the second Ethernet switch each configured to facilitate data communication with the first DSD;
a switch connection connected to the first Ethernet switch and the second Ethernet switch, the switch connection configured to facilitate data communication to and from each of the first and second Ethernet switches; and
a second backplane located adjacent to the first backplane, the second backplane comprising a second DSD and a third Ethernet switch slot, wherein the first Ethernet switch is connected to the third Ethernet switch slot, and the first Ethernet switch is further configured to facilitate data communication with the second DSD.

22. The system of claim 21, wherein the second backplane further comprises a plurality of rows of DSD slots.

23. The system of claim 21, wherein the first backplane is constructed to provide a first maximum data transfer rate and the second backplane is constructed to provide a second maximum data transfer rate.

24. The system of claim 21, wherein at least one backplane of the plurality of backplanes is configured to provide data communication using Serial Gigabit Media Independent Interface (SGMII) signals along the plurality of signal traces connecting the DSD slots to the plurality of Ethernet switch slots.

25. The system of claim 21, further comprising a chassis, and
wherein a backplane length of each backplane of the plurality of backplanes is longer than a backplane width of each backplane,
wherein a chassis length of the chassis is longer than a chassis width of the chassis, and
wherein the plurality of backplanes is mounted in the chassis so that the backplane length of each backplane is parallel to the chassis width.

26. The system of claim 21, further comprising a chassis, and
wherein a backplane length of each backplane of the plurality of backplanes is longer than a backplane width of each backplane,
wherein a chassis length of the chassis is longer than a chassis width of the chassis, and
wherein the plurality of backplanes is mounted in the chassis so that the backplane length of each backplane is parallel to the chassis length.

27. The system of claim 21, wherein the plurality of Ethernet switch slots of each backplane of the plurality of backplanes is located in a middle portion of the row of DSD slots.

28. A Data Storage Device (DSD) enclosure, comprising:
- a chassis;
- a plurality of backplanes mounted in the chassis, the plurality of backplanes each including:
  - a row of DSD slots;
  - a switch slot located in the row of DSD slots; and
  - a plurality of signal traces connecting the DSD slots to the switch slot; and
- wherein a first backplane of the plurality of backplanes includes a first switch constructed to provide a first maximum data transfer rate and a second backplane of the plurality of backplanes includes a second switch constructed to provide a second maximum data transfer rate different from the first maximum data transfer rate.

* * * * *